United States Patent
Ouyang et al.

(10) Patent No.: US 12,021,493 B1
(45) Date of Patent: Jun. 25, 2024

(54) DRIVING CIRCUIT FOR A SWITCHING TRANSISTOR AND A DRIVING DEVICE INCLUDING THE SAME

(71) Applicant: SANTAK ELECTRONIC (SHENZHEN) CO., LTD., Shenzhen (CN)

(72) Inventors: Huafen Ouyang, Shenzhen (CN); Hualiang Li, Shenzhen (CN); Dongxin Jin, Shenzhen (CN)

(73) Assignee: Santak Electronic (Shenzhen) Co., Ltd., Shenzhen (CN)

( * ) Notice: Subject to any disclaimer, the term of this patent is extended or adjusted under 35 U.S.C. 154(b) by 493 days.

(21) Appl. No.: 17/505,409

(22) Filed: Oct. 19, 2021

(30) Foreign Application Priority Data

Oct. 20, 2020 (CN) .......................... 202011124650.9

(51) Int. Cl.
    *H03F 3/26* (2006.01)
    *H03F 1/30* (2006.01)
    (Continued)

(52) U.S. Cl.
    CPC ............... *H03F 3/26* (2013.01); *H03F 1/307* (2013.01); *H03F 1/52* (2013.01); *H03F 3/245* (2013.01); *H03F 2200/351* (2013.01)

(58) Field of Classification Search
    CPC ... H03F 3/26; H03F 1/307; H03F 1/52; H03F 3/245
    See application file for complete search history.

(56) References Cited

U.S. PATENT DOCUMENTS

| 4,975,823 A | * | 12/1990 | Rilly | ...................... H02M 3/338 363/21.16 |
| 5,504,449 A | * | 4/1996 | Prentice | ........... H03K 17/04123 327/108 |

(Continued)

FOREIGN PATENT DOCUMENTS

| CN | 2372824 Y | 4/2000 |
| CN | 101764595 A | 6/2010 |
| CN | 101771343 A | 7/2010 |

OTHER PUBLICATIONS

CN Search Report for CN Application No. 202011124650.9, dated Sep. 16, 2021, 2 pages.

*Primary Examiner* — Patricia T Nguyen
(74) *Attorney, Agent, or Firm* — Stanek Lemon Crouse & Meeks, PA (57) ABSTRACT

The present invention provides a driving circuit for a switching transistor and a driving device including the same. The driving circuit includes: a power amplifier, including a first power transistor and a second power transistor that are connected between a first direct current voltage terminal and a second direct current voltage terminal and are arranged in a push-pull circuit; a first voltage regulating device, connected between an input terminal of the power amplifier and a control terminal of the first power transistor; a third power transistor, connected between an output terminal of the power amplifier and the second direct current voltage terminal or a grounding terminal; a first voltage dividing device, connected between the input terminal and the output terminal of the power amplifier; and a transistor control circuit, configured to: control the third power transistor to be turned on when the switching transistor is located in a short-circuit path, and control the third power transistor to be turned off when the switching transistor is controlled to be turned on and is not located in the short-circuit path. The (Continued)

driving circuit of the present invention reduces the power consumption of the switching transistor and extends the time for short-circuit protection.

18 Claims, 3 Drawing Sheets

(51) Int. Cl.
*H03F 1/52* (2006.01)
*H03F 3/24* (2006.01)

(56) References Cited

U.S. PATENT DOCUMENTS

| | | | |
|---|---|---|---|
| 6,198,347 B1 * | 3/2001 | Sander | H03F 3/1935 330/311 |
| 6,262,898 B1 * | 7/2001 | Louvel | H03K 17/61 363/133 |
| 6,597,157 B1 | 7/2003 | Boeckmann et al. | |
| 2004/0080364 A1 * | 4/2004 | Sander | H03F 1/0227 330/10 |
| 2007/0139839 A1 * | 6/2007 | Yoshihara | H03F 3/2173 361/93.1 |
| 2010/0014202 A1 * | 1/2010 | Forster | H03K 17/18 361/90 |
| 2014/0139268 A1 * | 5/2014 | Bayerer | H03K 17/063 327/109 |

* cited by examiner

DRIVING CIRCUIT FOR A SWITCHING TRANSISTOR AND A DRIVING DEVICE INCLUDING THE SAME

TECHNICAL FIELD

The present invention relates to the field of driving circuits, and in particular to a driving circuit for a switching transistor and a driving device including the same.

BACKGROUND ART

A driving circuit is located between a main circuit and a control circuit, and is configured to amplify a pulse-width modulation (PWM) signal outputted by the control circuit and output a PWM drive signal with amplified power. The PWM drive signal outputted by the driving circuit can drive a switching transistor of the main circuit.

Figure 1:
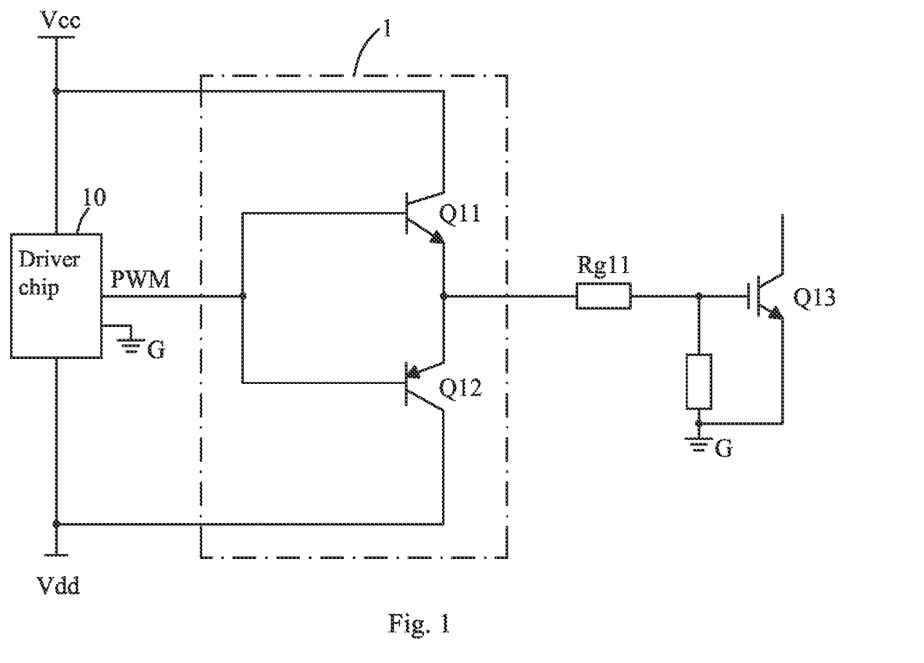
FIG. 1 is a circuit diagram in which a driving circuit is connected to a driver chip and a switching transistor in the prior art.

FIG. 1 is a circuit diagram in which a driving circuit is connected to a driver chip and a switching transistor in the prior art. As shown in FIG. 1, internal circuit modules of a driver chip 10 are known in the field, and will not be described in detail herein. Two power supply terminals of the driver chip 10 are respectively connected to a direct current voltage terminal Vcc (which has a first direct current voltage V1 of, for example, 15 volts or 18 volts) and a direct current voltage terminal Vdd (which has a second direct current voltage V2 of, for example, −5 volts). Another terminal of the driver chip 10 is grounded G. An output terminal of the driver chip 10 is configured to output a PWM signal having a high level and a low level equal to the first direct current voltage and the second direct current voltage, respectively.

A driving circuit 1 includes an NPN bipolar junction transistor Q11 and a PNP bipolar junction transistor Q12 which are connected between the direct current voltage terminal Vcc and the direct current voltage terminal Vdd. A collector of the NPN bipolar junction transistor Q11 is connected to the direct current voltage terminal Vcc. A collector of the PNP bipolar junction transistor Q12 is connected to the direct current voltage terminal Vdd. A base of the NPN bipolar junction transistor Q11 is connected to a base of the PNP bipolar junction transistor Q12, is used as an input terminal of the driving circuit 1, and is connected to an output terminal of the driver chip 10. An emitter of the NPN bipolar junction transistor Q11 is connected to an emitter of the PNP bipolar junction transistor Q12 and is used as an output terminal of the driving circuit 1.

The driving circuit 1 forms a power amplifier for power amplifying (specifically, current amplifying) the PWM signal outputted by the driver chip 10 and provide a PWM drive signal with amplified power to a gate of an insulated gate bipolar transistor Q13 through a driving resistor Rg, to control the turning on and off of the insulated gate bipolar transistor Q13. The insulated gate bipolar transistor Q13 and another insulated gate bipolar transistor (not shown in FIG. 1) are connected to one same bridge. That is, a collector of the insulated gate bipolar transistor Q13 is connected to an emitter of said another insulated gate bipolar transistor or a direct current bus.

Specifically, when the PWM signal outputted by the driver chip 10 is at the high level (that is, the first direct current voltage V1), the NPN bipolar junction transistor Q11 is turned on, and the PNP bipolar junction transistor Q12 is turned off. In this case, a voltage outputted by the driving circuit 1 is equal to a difference of subtracting a forward voltage drop of the NPN bipolar junction transistor Q11 from the first direct current voltage V1, which is slightly less than the first direct current voltage V1, and is provided to the gate of the insulated gate bipolar transistor Q13 through the driving resistor Rg to control the insulated gate bipolar transistor Q13 to be turned on. When the PWM signal outputted by the driver chip 10 is at the low level (that is, the second direct current voltage V2), the NPN bipolar junction transistor Q11 is turned off, and the PNP bipolar junction transistor Q12 is turned on. In this case, the voltage outputted by the driving circuit 1 is equal to a difference of subtracting a forward voltage drop of the PNP bipolar junction transistor Q12 from the second direct current voltage V2, and is provided to the gate of the insulated gate bipolar transistor Q13 through the driving resistor Rg to control the insulated gate bipolar transistor Q13 to be turned off.

The high level of the PWM drive signal outputted by the driving circuit 1 in the prior art is approximately equal to the first direct current voltage V1, which is usually 15 volts or 18 volts. When a driving voltage outputted by the driving circuit 1 is relatively high, i.e., 18 volts, a forward voltage drop between the collector and an emitter of the insulated gate bipolar transistor Q13 is relatively small. Therefore, the power loss is small, and the efficiency is high. Because a short-circuit current in the switching transistor is positively correlated to a driving voltage of the switching transistor, when the driving voltage is large and the insulated gate bipolar transistor Q13 is located in a short-circuit path (that is, the insulated gate bipolar transistor Q13 and an insulated gate bipolar transistor connected to the same bridge as the insulated gate bipolar transistor Q13 are simultaneously turned on), the short-circuit current is large and rises fast. Therefore, there is no time for short-circuit protection of the insulated gate bipolar transistor Q13, thereby causing damage thereto. In contrast, when the driving voltage outputted by the driving circuit 1 is 15 volts, the short-circuit current in the insulated gate bipolar transistor Q13 rises relatively slowly, and short-circuit protection can be performed on the insulated gate bipolar transistor Q13. However, a turn-on loss of the insulated gate bipolar transistor Q13 is relatively high, and the efficiency is relatively low.

SUMMARY OF THE INVENTION

In view of the foregoing technical problems in the prior art, the present invention provides a driving circuit for a switching transistor including a control terminal, a first electrode, and a second electrode. The driving circuit includes:

a power amplifier, including a first power transistor and a second power transistor that are connected between a first direct current voltage terminal and a second direct current voltage terminal and are arranged in a push-pull circuit, where an input terminal of the power amplifier is configured to receive a pulse-width modulation (PWM) signal, an output terminal of the power amplifier outputs a PWM drive signal with amplified power and is connected to the control terminal of the switching transistor by a driving resistor, and a high level of the PWM signal is equal to a potential of the first direct current voltage terminal;

a first voltage regulating device, connected between the input terminal of the power amplifier and a control terminal of the first power transistor, where a first predetermined voltage is applied across the first voltage regulating device;

a third power transistor, connected between the output terminal of the power amplifier and the second direct current voltage terminal or a grounding terminal;

a first voltage dividing device, connected between the input terminal and the output terminal of the power amplifier, and configured to turn on the first power transistor when the third power transistor is turned on; and a transistor control circuit, configured to: control the third power transistor to be turned on when the switching transistor is located in a short-circuit path, and control the third power transistor to be turned off when the switching transistor is controlled to be turned on and is not located in the short-circuit path.

Preferably, the transistor control circuit includes: a second voltage dividing device having one end connected to the first direct current voltage terminal; and a diode having a cathode connected to the first electrode of the switching transistor, and a node formed by connecting an anode of the diode and the other end of the second voltage dividing device is electrically connected to a control terminal of the third power transistor.

Preferably, the transistor control circuit further includes a second voltage regulating device connected between the control terminal of the third power transistor and the node, and configured to provide a second predetermined voltage between the node and the control terminal of the third power transistor. When the switching transistor is controlled to be turned on and is not located in the short-circuit path, a difference of subtracting the second predetermined voltage from a voltage between the node and the second direct current voltage terminal or the grounding terminal is less than a turn-on voltage of the third power transistor.

Preferably, the first voltage dividing device is a first resistor, and the second voltage dividing device is a second resistor.

Preferably, the driving circuit further includes a third resistor connected to the third power transistor in series. One end of the third resistor is connected to the output terminal of the power amplifier or the control terminal of the switching transistor, and the other end of the third resistor is connected to the second direct current voltage terminal or the grounding terminal by the third power transistor. The third resistor is configured such that a voltage across the first voltage dividing device is not less than a sum of the first predetermined voltage and a turn-on voltage of the first power transistor when the third power transistor is turned on.

Preferably, the first voltage regulating device is a first voltage regulating diode having an anode connected to the control terminal of the first power transistor, and a cathode connected to the input terminal of the power amplifier.

Preferably, the first voltage regulating device is a first diode assembly including a plurality of diodes connected in series, an anode of the first diode assembly is connected to the input terminal of the power amplifier, and a cathode of the first diode assembly is connected to the control terminal of the first power transistor.

Preferably, the second voltage regulating device is a second voltage regulating diode having an anode connected to the control terminal of the third power transistor, and a cathode connected to the node.

Preferably, the second voltage regulating device is a second diode assembly including a plurality of diodes connected in series, an anode of the second diode assembly is connected to the node, and a cathode of the second diode assembly is connected to the control terminal of the third power transistor.

Preferably, the third power transistor includes: a first electrode electrically connected to the output terminal of the power amplifier or the control terminal of the switching transistor, a second electrode electrically connected to the second direct current voltage terminal or the grounding terminal, and the control terminal electrically connected to the node.

Preferably, the potential of the first direct current voltage terminal is greater than a ground potential, and the second direct current voltage terminal has a potential less than or equal to the ground potential.

Preferably, the first power transistor is an NPN bipolar junction transistor, and the second power transistor is a PNP bipolar junction transistor. A collector of the NPN bipolar junction transistor and a collector of the PNP bipolar junction transistor are respectively connected to the first direct current voltage terminal and the second direct current voltage terminal. An emitter of the NPN bipolar junction transistor is connected to an emitter of the PNP bipolar junction transistor and is used as the output terminal of the power amplifier. A base of the NPN bipolar junction transistor is connected to a base of the PNP bipolar junction transistor by the first voltage regulating device and is used as the input terminal of the power amplifier.

The present invention further provides a driving device for a switching transistor, including:

a driver chip, configured to output a pulse-width modulation (PWM) signal; and the driving circuit as described above, configured to receive the PWM signal, and output a PWM drive signal with amplified power to the switching transistor.

The driving circuit of the present invention can reduce the power loss of the switching transistor, improve the operating efficiency of the switching transistor, and at the same time extend the time for short-circuit protection of the switching transistor.

BRIEF DESCRIPTION OF THE DRAWINGS

Embodiments of the present invention are further described below with reference to the accompanying drawings, in which.

DETAILED DESCRIPTION

To make the objectives, technical schemes, and advantages of the present invention more comprehensible, the present invention is further described below in detail with reference to the accompanying drawings and specific embodiments.

Figure 2:
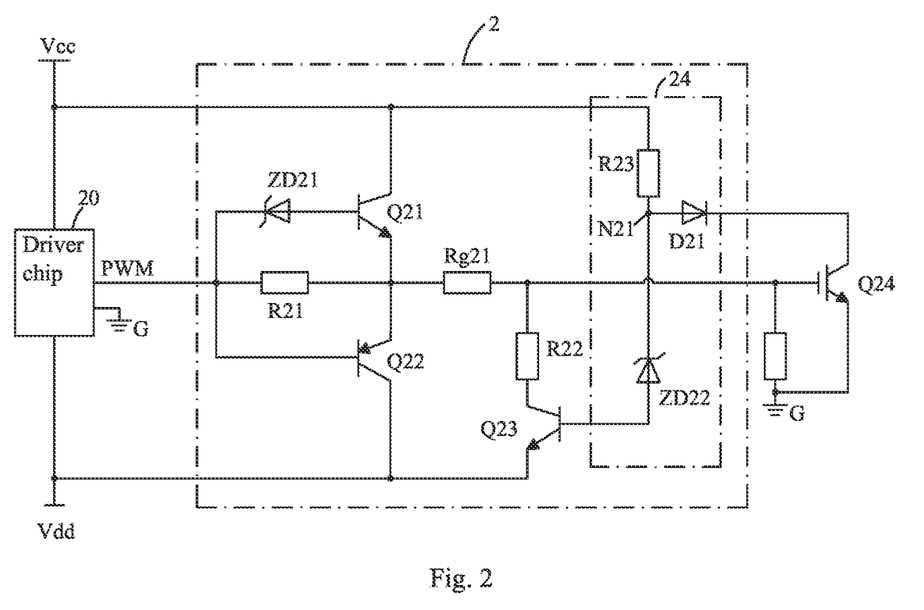
FIG. 2 is a circuit diagram in which a driving circuit is connected to a driver chip and a switching transistor according to a first embodiment of the present invention.

FIG. 2 is a circuit diagram in which a driving circuit is connected to a driver chip and a switching transistor according to a first embodiment of the present invention. A driving circuit 2 is designed to drive an insulated gate bipolar transistor Q24. As shown in FIG. 2, a driver chip 20 is the same as the driver chip 10 shown in FIG. 1, and will not be described again herein.

The driving circuit 2 includes a power amplifier formed by an NPN bipolar junction transistor Q21 and a PNP bipolar junction transistor Q22, a voltage regulating diode ZD21, a resistor R21, a resistor R22 and an NPN bipolar junction transistor Q23 that are connected in series, and a transistor control circuit 24 configured to control the NPN bipolar junction transistor Q23.

The NPN bipolar junction transistor Q21 and the PNP bipolar junction transistor Q22 are connected to form a push-pull circuit. That is, a collector of the NPN bipolar junction transistor Q21 is connected to a direct current voltage terminal Vcc. A collector of the PNP bipolar junction transistor Q22 is preferably connected to a direct current voltage terminal Vdd. A base of the NPN bipolar junction transistor Q21 is connected to a base of the PNP bipolar junction transistor Q22 by the voltage regulating diode ZD21 and is connected to an output terminal of the driver chip 20. An emitter of the NPN bipolar junction transistor Q21 is connected to an emitter of the PNP bipolar junction transistor Q22 and is used as an output terminal of the power amplifier, and is connected to a gate of the insulated gate bipolar transistor Q24 by a driving resistor Rg21.

A resistor R21 is connected between a cathode (that is, an input terminal of the power amplifier) of the voltage regulating diode ZD21 and the emitter (that is, the output terminal of the power amplifier) of the NPN bipolar junction transistor Q21. The resistor R22 and the NPN bipolar junction transistor Q21 which are connected in series are connected between the emitter of the NPN bipolar junction transistor Q21 and the direct current voltage terminal Vdd.

The transistor control circuit 24 includes a voltage regulating diode ZD22, a resistor R23, and a diode D21. One end of the resistor R23 is connected to the direct current voltage terminal Vcc, and the other end of the resistor R23 is connected to an anode of the diode D21 in order to form a node N21. A cathode of the diode D21 is connected to a collector of the insulated gate bipolar transistor Q24. An anode of the voltage regulating diode ZD22 is connected to a base of the NPN bipolar junction transistor Q23. A cathode of the voltage regulating diode ZD22 is connected to the node N21.

The working principle of the driving circuit 2 will be described below according to different working states of the insulated gate bipolar transistor Q24.

When the insulated gate bipolar transistor Q24 works normally (that is, not located in a short-circuit path) and a PWM signal outputted by the driver chip 20 is at a high level, a voltage drop occurs across the resistor R21, to forward bias an emitter junction of the NPN bipolar junction transistor Q21, so that the NPN bipolar junction transistor Q21 is turned on, and at the same time the PNP bipolar junction transistor Q22 is turned off. In this case, a voltage at the emitter of the NPN bipolar junction transistor Q21 is V1-Vzd-Vbe, where V1 is a voltage at the direct current voltage terminal Vcc (for example, 18 volts), Vzd is a regulating voltage of the voltage regulating diode ZD21 (that is, a reverse breakdown voltage), which is for example, 3 volts, and Vbe is an emitter junction turn-on voltage of the NPN bipolar junction transistor Q21, which is for example, 0.7 volts. A PWM drive signal provided by the emitter of the NPN bipolar junction transistor Q21 is transmitted to the gate of the insulated gate bipolar transistor Q24 by the driving resistor Rg21 and turns on the insulated gate bipolar transistor Q24. The direct current voltage terminal Vcc, the resistor R23, the diode D21, and the insulated gate bipolar transistor Q24 which is turned on form a conductive path. In this way, a voltage of the node N21 is equal to a sum of a turn-on voltage of the diode D21 and a turn-on voltage of the insulated gate bipolar transistor Q24 (slightly greater than 0.7 volts). By selecting a voltage regulating diode ZD22 with appropriate parameters, for example, a voltage regulating diode ZD22 having a regulating voltage greater than a voltage between the node N21 and the direct current voltage terminal Vdd, the transistor control circuit 24 makes the bipolar junction transistor Q23 to be in an off state. Because the bipolar junction transistor Q23 is turned off and the insulated gate bipolar transistor Q24 is in an on state, the current at the gate of the insulated gate bipolar transistor Q24 is almost zero. In this case, there is almost no current in the resistor R21 and the driving resistor Rg21, so that a value of a voltage at the gate of the insulated gate bipolar transistor Q24 gradually rises from V1-Vzd-Vbe to V1. The relatively high driving voltage V1 reduces the turn-on loss of the insulated gate bipolar transistor Q24.

When the insulated gate bipolar transistor Q24 works normally (that is, not located in the short-circuit path) and the PWM signal outputted by the driver chip 20 is at a low level, the NPN bipolar junction transistor Q21 is turned off, and the PNP bipolar junction transistor Q22 is turned on. A voltage of the emitter of the PNP bipolar junction transistor Q22 is approximately a second direct current voltage V2. The voltage at the gate of the insulated gate bipolar transistor Q24 is the second direct current voltage V2. In this way, the insulated gate bipolar transistor Q24 is controlled to be turned off.

When the PWM signal outputted by the driver chip 20 is at the high level and at the same time the insulated gate bipolar transistor Q24 is located in the short-circuit path (that is, the insulated gate bipolar transistor Q24 and the switching transistor connected to the same bridge as the insulated gate bipolar transistor Q24 are simultaneously turned on), a short-circuit current in the insulated gate bipolar transistor Q24 increases rapidly and a voltage Vce between the collector and an emitter of the insulated gate bipolar transistor Q24 rises. When the voltage Vce exceeds the regulating voltage of the voltage regulating diode ZD22, the transistor control circuit 24 provides a forward bias voltage to the emitter junction of the NPN bipolar junction transistor Q23 and immediately turns on the NPN bipolar junction transistor Q23. In this case, the output terminal of the driver chip 20, the resistor R21, the resistor Rg21, the resistor R22, the NPN bipolar junction transistor Q23 that is turned on, and the direct current voltage terminal Vdd form a conductive path, so that a current in the resistor R21 increases, and the voltage drop across the resistor R21 is greater than a sum of the regulating voltage of the voltage regulating diode ZD21 and the emitter junction turn-on voltage of the NPN bipolar junction transistor Q21. In this way, the NPN bipolar junction transistor Q21 is turned on, and the voltage at the emitter of the NPN bipolar junction transistor Q21 is equal to V1-Vzd-Vbe, where V1 is a voltage at the direct current voltage terminal Vcc, Vzd is the regulating voltage of the voltage regulating diode ZD21 (that is, a reverse breakdown voltage), and Vbe is the emitter junction turn-on voltage of the NPN bipolar junction transistor Q21. Immediately after the NPN transistor Q23 is turned on (for example, within 300 nanoseconds), the voltage at the emitter of the NPN bipolar junction transistor Q21 is caused to drop by Vzd+Vbe.

The voltage at the emitter of the NPN bipolar junction transistor Q21 is provided to the gate of the insulated gate bipolar transistor Q24 through the driving resistor Rg21. Because the short-circuit current in the insulated gate bipolar transistor Q24 is positively correlated to a driving voltage of thereof, and the driving voltage of the insulated gate bipolar transistor Q24 decreases by Vzd+Vbe, so that a maximum short-circuit current in the insulated gate bipolar transistor Q24 is limited, ensuring that there is enough time for short-circuit protection of the insulated gate bipolar transistor Q24.

The driving circuit 2 can automatically provide the driving voltage V1 or a driving voltage V1-Vzd-Vbe to the insulated gate bipolar transistor Q24 without software control, and can automatically switch output of the two different driving voltages within nanoseconds according to a working state of the insulated gate bipolar transistor Q24, thereby implementing both low power consumption and high efficiency and extending the time for short-circuit protection.

In the embodiments of the present invention, when the insulated gate bipolar transistor Q24 is located in the short-circuit path, the driving circuit 2 can make a drop value of the driving voltage of the insulated gate bipolar transistor Q24 equal to the sum of the regulating voltage of the voltage regulating diode ZD21 and the emitter junction turn-on voltage of the NPN bipolar junction transistor Q21. The regulating voltage of the voltage regulating diode ZD21 may be selected according to an actual requirement, and there is no limit thereto.

The resistor R22 with an appropriate resistance value is selected, so that when the NPN bipolar junction transistor Q23 is turned on, a value of a voltage across the resistor R21 is not less than Vzd+Vbe, to turn on the NPN bipolar junction transistor Q21.

When the PWM signal outputted by the driver chip 20 is at the high level and the insulated gate bipolar transistor Q24 is controlled to be turned on, the resistor R23 in the transistor control circuit 24 is configured to perform voltage division, to make the voltage of the node N21 equal to a sum of a forward turn-on voltage of the diode D21 and the turn-on voltage of the insulated gate bipolar transistor Q24. In this case, the transistor control circuit 24 is configured to control the NPN bipolar junction transistor Q23 to be turned off, to further cause the driving voltage of the insulated gate bipolar transistor Q24 to gradually rise to V1. When the insulated gate bipolar transistor Q24 is normally turned on, the voltage regulating diode ZD22 with a second regulating voltage is selected, to make a difference of subtracting the second regulating voltage from the voltage between the node N21 and the direct current voltage terminal Vdd less than a turn-on voltage of the NPN bipolar junction transistor Q23 (for example, 0.7 volts), to further ensure that the NPN bipolar junction transistor Q23 is kept in an off state. When the insulated gate bipolar transistor Q24 is located in the short-circuit path, the NPN bipolar junction transistor Q23 is turned on.

The diode D21 in the transistor control circuit 24 is preferably a diode with high withstand voltage. When the insulated gate bipolar transistor Q24 is turned on, the resistor R23, the diode D21, and the insulated gate bipolar transistor Q24 that is turned on form a conductive path, to make the voltage of the node N21 slightly greater than 0.7 volts, thereby ensuring that the NPN bipolar junction transistor Q23 is turned off. In addition, when the insulated gate bipolar transistor Q24 is turned off, a voltage at the collector of the insulated gate bipolar transistor Q24 is approximately equal to a bus voltage. The diode D21 is reversely turned off, and the voltage at the collector of the insulated gate bipolar transistor Q24 can be prevented from being provided to the NPN bipolar junction transistor Q21 and the driver chip 20 through the resistor R23, thereby protecting the driver chip 20 and the driving circuit 2 from being damaged.

Figure 3:
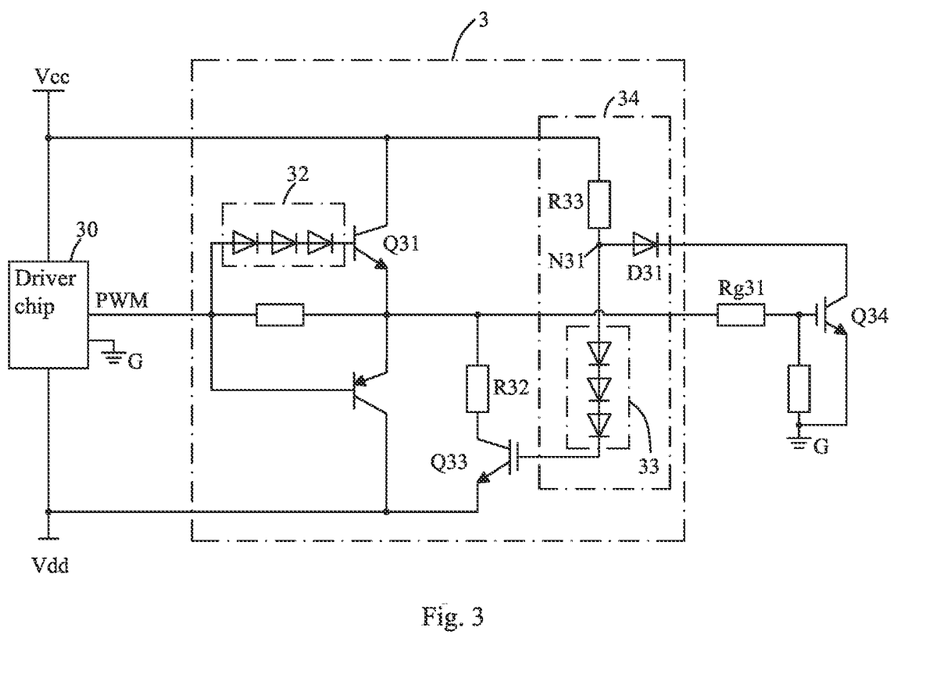
FIG. 3 is a circuit diagram in which a driving circuit is connected to a driver chip and a switching transistor according to a second embodiment of the present invention.

FIG. 3 is a circuit diagram in which a driving circuit is connected to a driver chip and a switching transistor according to a second embodiment of the present invention. FIG. 3 is basically the same as FIG. 2, with differences lying in that in a driving circuit 3, the NPN bipolar junction transistor Q23 in the driving circuit 2 is replaced with an insulated gate bipolar transistor Q33, the voltage regulating diode ZD21 in the driving circuit 2 is replaced with a diode assembly 32, the voltage regulating diode ZD22 is replaced with a diode assembly 33 in a transistor control circuit 34. In addition, one end of a resistor R32 is connected to an emitter (that is, an output terminal of a power amplifier) of an NPN bipolar junction transistor Q31, and the other end of the resistor R32 is connected to a collector of the insulated gate bipolar transistor Q33.

The diode assembly 32 includes a plurality of diodes connected in series (three diodes are shown in FIG. 3). An anode of the diode assembly 32 is connected to an output terminal of a driver chip 30, and a cathode of the diode assembly 32 is connected to a base of the NPN bipolar junction transistor Q31. An anode of the diode assembly 33 is connected to a node N31 formed by connecting a resistor R33 and an anode of a diode D31. A cathode of the diode assembly 33 is connected to a gate (and a control terminal) of the insulated gate bipolar transistor Q33.

The working principle of the driving circuit 3 is the same as the driving circuit 2 shown in FIG. 2, and will not be described again herein. According to different actual requirements, by selecting a quantity of diodes connected in series in the diode assembly 32, a predetermined voltage drop occurs across the diode assembly 32. When an insulated gate bipolar transistor Q34 is located in a short-circuit path, a driving voltage of the insulated gate bipolar transistor Q34 can be reduced by V32+Vbe, where V32 is a forward voltage drop of the diode assembly 32, and Vbe is an emitter junction turn-on voltage of the NPN bipolar junction transistor Q31. When the insulated gate bipolar transistor Q34 is turned on, the number of diodes connected in series in the diode assembly 33 is selected according to the voltage between the node N31 and an emitter of the insulated gate bipolar transistor Q33, so that the predetermined voltage drop occurs across the diode assembly 33. The present invention is not intended to limit the number of diodes in the diode assembly 32 or 33 to 3. There may be more or fewer than three diodes.

In other embodiments of the present invention, the insulated gate bipolar transistor Q33 or the NPN bipolar junction transistor Q23 in the foregoing embodiments may be replaced with a switching transistor, such as a field effect transistor, where a gate (i.e., a control electrode) of the field effect transistor is electrically connected to the node N31 or the node N21.

In another embodiment of the present invention, the NPN bipolar junction transistor Q21 and the PNP bipolar junction transistor Q22 are respectively replaced with an N channel field effect transistor and a P channel field effect transistor, among other power transistors.

The present invention is not intended to limit a potential of a first direct current voltage terminal to 18 volts and a potential of a second direct current voltage terminal to −5 volts. A high level and a low level having other potential values may be selected according to an actual requirement.

In other embodiments of the present invention, the power amplifier includes a first power transistor and a second power transistor that are connected between a first direct current voltage terminal and a second direct current voltage terminal and are arranged in a push-pull circuit. A first electrode of a third power transistor is connected to an output terminal of the power amplifier. A second electrode of the third power transistor is connected to the second direct current voltage terminal or a grounding terminal. The potential of the first direct current voltage terminal is equal to a high level of a PWM signal outputted by a driver chip. A potential of the second direct current voltage terminal is equal to or less than a ground potential, and may be equal to or not equal to a low level of the PWM signal. For example, the collector of the PNP bipolar junction transistor Q22 and an emitter of the NPN bipolar junction transistor Q23 may have a potential equal to or less than the ground potential.

In other embodiments of the present invention, the resistor R21 or the resistor R23 in the foregoing embodiments may be replaced with other electronic devices that can perform a voltage dividing function on a direct current voltage. The voltage regulating diode ZD21, the voltage regulating diode ZD22, the diode assembly 32 or the diode assembly 33 may be replaced with a voltage regulating device having an appropriate regulating or predetermined voltage value across the voltage regulating device.

The driving circuit of the present invention can provide a PWM drive signal to a control electrode of a switching transistor such as an insulated gate bipolar transistor or a metal-oxide-semiconductor field effect transistor.

The present invention further provides a driving device for a switching transistor, including a driver chip configured to output a PWM signal; and the driving circuit configured to receive the PWM signal outputted by the driver chip, and output a PWM drive signal with amplified power to the switching transistor.

Although the present invention has been described by way of preferred embodiments, the present invention is not limited thereto, and various modifications and variations made without departing from the scope of the present invention shall fall within the protection scope of the present invention.

What is claimed is:

1. A driving circuit for a switching transistor, wherein the switching transistor comprises a control terminal, a first electrode, and a second electrode, and the driving circuit comprises:
   a power amplifier comprising a first power transistor and a second power transistor that are connected between a first direct current voltage terminal and a second direct current voltage terminal in a push-pull circuit, wherein an input terminal of the power amplifier is configured to receive a pulse-width modulation (PWM) signal, an output terminal of the power amplifier outputs a PWM drive signal and is connected to the control terminal of the switching transistor by a driving resistor;
   a first voltage regulating circuit connected between the input terminal of the power amplifier and a control terminal of the first power transistor and providing a first predetermined voltage therebetween;
   a third power transistor connected between the output terminal of the power amplifier and the second direct current voltage terminal or a grounding terminal;
   a first voltage dividing circuit connected between the input terminal and the output terminal of the power amplifier and configured to turn on the first power transistor when the third power transistor is turned on; and
   a transistor control circuit configured to control the third power transistor to be turned on when the switching transistor is located in a short-circuit path and control the third power transistor to be turned off when the switching transistor is controlled to be turned on and is not located in the short-circuit path.

2. The driving circuit according to claim 1, wherein the transistor control circuit comprises:
   a second voltage dividing circuit having a first terminal connected to the first direct current voltage terminal and comprising
   a diode having a cathode connected to the first electrode of the switching transistor, and a node formed by connecting an anode of the diode wherein a second terminal of the second voltage dividing circuit is electrically connected to a control terminal of the third power transistor.

3. The driving circuit according to claim 2, wherein the transistor control circuit further comprises a second voltage regulating circuit connected between the control terminal of the third power transistor and the node and configured to provide a second predetermined voltage between the node and the control terminal of the third power transistor and, when the switching transistor is controlled to be turned on and is not located in the short-circuit path, a difference between the second predetermined voltage and a voltage between the node and the second direct current voltage terminal or the grounding terminal is less than a turn-on voltage of the third power transistor.

4. The driving circuit according to claim 2, wherein the first voltage dividing comprises a first resistor and the second voltage dividing device comprises a second resistor.

5. The driving circuit according to claim 4, wherein the driving circuit further comprises a third resistor connected to the third power transistor in series, wherein a first terminal of the third resistor is connected to the output terminal of the power amplifier or the control terminal of the switching transistor, a second terminal of the third resistor is connected to the second direct current voltage terminal or the grounding terminal by the third power transistor, and the third resistor is configured such that a voltage across the first voltage dividing device is not less than a sum of the first predetermined voltage and a turn-on voltage of the first power transistor when the third power transistor is turned on.

6. The driving circuit according to claim 1, wherein the first voltage regulating circuit comprises a first voltage regulating diode having an anode connected to the control terminal of the first power transistor and a cathode connected to the input terminal of the power amplifier.

7. The driving circuit according to claim 1, wherein the first voltage regulating circuit comprises a first diode assembly comprising a plurality of diodes connected in series, an anode of the first diode assembly is connected to the input terminal of the power amplifier, and a cathode of the first diode assembly is connected to the control terminal of the first power transistor.

8. The driving circuit according to claim 3, wherein the second voltage regulating circuit comprises a second voltage regulating diode having an anode connected to the control terminal of the third power transistor and a cathode connected to the node.

9. The driving circuit according to claim 3, wherein the second voltage regulating circuit comprises a second diode assembly comprising a plurality of diodes connected in series, an anode of the second diode assembly is connected to the node, and a cathode of the second diode assembly is connected to the control terminal of the third power transistor.

10. The driving circuit according to claim 2, wherein the third power transistor comprises a first electrode electrically connected to the output terminal of the power amplifier or the control terminal of the switching transistor, a second electrode electrically connected to the second direct current voltage terminal or the grounding terminal, and a control terminal electrically connected to the node.

11. The driving circuit according to claim 1, wherein the potential of the first direct current voltage terminal is greater than a ground potential and the second direct current voltage terminal has a potential less than or equal to the ground potential.

12. The driving circuit according to claim 1, wherein the first power transistor is an NPN bipolar junction transistor, the second power transistor is a PNP bipolar junction transistor, a collector of the NPN bipolar junction transistor and a collector of the PNP bipolar junction transistor are respectively connected to the first direct current voltage terminal and the second direct current voltage terminal, an emitter of the NPN bipolar junction transistor is connected to an emitter of the PNP bipolar junction transistor and used as the output terminal of the power amplifier, and a base of the NPN bipolar junction transistor is connected to a base of the PNP bipolar junction transistor by the first voltage regulating device and is used as the input terminal of the power amplifier.

13. A driving device for a switching transistor, comprising:
　a driver chip, configured to output a pulse-width modulation (PWM) signal; and
　the driving circuit according to claim 1 configured to receive the PWM signal.

14. A driving circuit for a switching transistor, the driving circuit comprising:
　a push-pull circuit comprising a first transistor and a second transistor coupled between a first power supply terminal and a second power supply terminal, wherein a control terminal of the second transistor is coupled to an input terminal of the driving circuit;
　a first diode coupled between the input terminal of the driving circuit and a control terminal of the first transistor;
　a first resistor coupled between a control terminal of the switching transistor and an output terminal of the push-pull circuit;
　a second resistor coupled between the input terminal of the driving circuit and the output terminal of the push-pull circuit;
　a third transistor coupled between the first resistor and the second power supply terminal or a grounding terminal;
　a second diode coupled to a first electrode of the switching transistor; and
　a third diode coupled between a control terminal of the third transistor and a node at which the second diode and the third transistor are connected.

15. The driving circuit of claim 14, wherein the first and third diodes comprise respective zener diodes.

16. The driving circuit of claim 14, wherein the first and third diodes comprise respective first and second groups of serially-connected diodes.

17. The driving circuit of claim 14, wherein the switching transistor comprises a bipolar transistor and wherein the second transistor operates responsive to a collector to emitter voltage of the switching transistor such that a voltage applied to the control terminal of the switching transmitter decreases proportionally to an increase in the collector to emitter voltage of the switching transistor.

18. The driving circuit of claim 14, further comprising a fourth resistor coupled in series with the third transistor.

* * * * *